United States Patent [19]

Dudley et al.

[11] Patent Number: 5,796,621
[45] Date of Patent: Aug. 18, 1998

[54] CIRCUIT DELAY ABSTRACTION TOOL

[75] Inventors: Peter E. Dudley, Essex Junction; Paul T. Gutwin, Williston, both of Vt.; Gara Pruesse, Toronto, Canada

[73] Assignee: International Business Machines Corporation, Armonk, N.J.

[21] Appl. No.: 688,936

[22] Filed: Jul. 31, 1996

[51] Int. Cl.$^6$ .................................................. G06F 17/50
[52] U.S. Cl. ..................... 364/489; 364/490; 364/578; 395/500
[58] Field of Search .................... 364/488, 489, 364/490, 491, 578; 395/500, 140

[56] References Cited

U.S. PATENT DOCUMENTS

| | | | |
|---|---|---|---|
| 5,257,201 | 10/1993 | Berman et al. | 364/489 |
| 5,450,535 | 9/1995 | North | 395/140 |
| 5,475,607 | 12/1995 | Apte et al. | 364/489 |
| 5,535,145 | 7/1996 | Hathaway | 364/578 |

OTHER PUBLICATIONS

Blaquiere et al., "Timing Analysis Speed-up ...", IEEE, pp. 244–255, Feb. 1996.
Cimikowski et al., "A Neural Network Algorithm for a Graph Layout Problem", IEEE, pp. 341–345, Apr. 1996.
Kobayashi et al., "Delay Abstraction in Combination Logic Circuits" IEEE, pp. 453–458, 1995.
Ziavras, "Rh: A Versatile Family of Reduced ...", IEEE, pp. 1210–1220, Nov. 1994.
Watanabe et al., "Minimum Cost Augmentation ...", IEEE, pp. 2311–2314, 1993.
Johnson et al., "Optimal Algorithms for the Vertex ...", IEEE, pp. 306–314, 1992.
Lee, "A Parallel Improvement Algorithm for the Bipartite Subgraph Problem", IEEE, pp. 139–145, Jan. 1992.
"Hierarchical Delay Predictor and Corrector" IBM Technical Disclosure Bulleton, vol. 33, No. 2, Jul. 1990.
Frank, "Augmenting Graphs to meet Edge-Connectivity Requirements" IEEE, pp. 708–718, 1990.
Introduction to Algorithms. Cormen, Leiserson and Rivest. Third Printing Q A766 C662, ISBN0-07-013 143-0 (McGraw-Hill), 1991.

*Primary Examiner*—Kevin J. Teska
*Assistant Examiner*—A. S. Roberts
*Attorney, Agent, or Firm*—Richard M. Kotulak

[57] ABSTRACT

What is provided is a system and method for reducing the storage requirements for delay networks used in performing timing analysis. A circuit delay network is transformed by processing all the possible hubs of the input pairs which are created from a bipartite delay graph of the circuit. A smaller delay network is formed by iteratively selecting the hub with the largest edge-saving and removing the conflicts from the remaining unselected hubs. The selections continues until there are no longer any unselected hubs. Further processing can occur using the selected hubs as inputs to insure that there are no further layers of hubs. The composite of all selected hubs and any inputs and outputs that do not contained hubs is an abstracted delay model for the circuit which can be efficiently stored. These models are subsequently used to reduce the computational requirements for timing analysis performed on delay networks at a higher level.

14 Claims, 12 Drawing Sheets

| W | A | B |
|---|---|---|
| A | 0 | 10 |
| B | -10 | 0 |

| X | A | B |
|---|---|---|
| A | 0 | 4 |
| B | -4 | 0 |

| Y | A | B |
|---|---|---|
| A | 0 | 10 |
| B | -10 | 0 |

| Z | A | B |
|---|---|---|
| A | 0 | 10 |
| B | -10 | 0 |

| | W | X | Y | Z |
|---|---|---|---|---|
| W | 0 | 0 | 2 | -2 |
| X | 0 | 0 | 2 | -2 |
| Y | -2 | -2 | 0 | -4 |
| Z | 2 | 2 | 4 | 0 |

B

| | W | X | Y | Z |
|---|---|---|---|---|
| W | 0 | -6 | 2 | -2 |
| X | 6 | 0 | 8 | 4 |
| Y | -2 | -8 | 0 | -4 |
| Z | 2 | -4 | 4 | 0 |

|   | A | B | C |
|---|---|---|---|
| A | 0 | 10 | 6 |
| B | -10 | 0 | -4 |
| C | -6 | 4 | 0 |

X

|   | A | B | C |
|---|---|---|---|
| A | 0 | 4 | 0 |
| B | -4 | 0 | -4 |
| C | 0 | 0 | 0 |

Y

|   | A | B | C |
|---|---|---|---|
| A | 0 | 10 | 6 |
| B | -10 | 0 | -4 |
| C | -6 | 4 | 0 |

Z

|   | A | B | C |
|---|---|---|---|
| A | 0 | 10 | 6 |
| B | -10 | 0 | -4 |
| C | -6 | 4 | 0 |

FIGURE 16

Step 1:

```
rlib minimal.genlib
read_blif C432.blif;
map -s;
print_delay -m unit;
rdnet -m unit -H 2 -f results.out;
```

FIGURE 24

CIRCUIT DELAY ABSTRACTION TOOL

BACKGROUND OF THE INVENTION

One of the problems facing Integrated Circuit (IC) designers is finding a way to quickly simulate the behavior of large digital VLSI circuits. Generally, a digital IC consists of networks of combinational logic partitioned by storage elements called latches or registers. The modelling of these networks of combinational logic circuits can be divided into two realms: the functional and temporal. The concern of the functional domain is the final values of the output vector at the circuit's outputs in response to an input vector. The concern of the temporal domain is the amount of time required for the final values of the output vector to appear in response to a change in the input vector. This delay information can be represented as a weighted graph known as a delay network.

Combinational logic circuits are usually modelled as networks of discrete components. Each component typically represents an atomic boolean function, or gate, which is most often composed of several transistors. In addition, a specific delay is associated with each component. The derivation of these gate delays is called the delay model of the circuit. There are two basic types: the static delay model where the value of the delay is fixed, and the dynamic model where the value of the delay is, in part, a function of the input waveform.

Once delays have been assigned to each component in a combinational logic circuit's network, the circuit can be modelled as a weighted, directed graph, where the nodes of the graph are the gates of the circuit and the weights on the nodes are the delays of the gates. Using static timing analysis, the delay of the circuit is then the path through the graph with the largest edge weight sum. In the case of purely combinational circuit the network will be acyclic, and the topological sort algorithm can be used to find the longest, or critical, path. The critical paths for each input/output pair, then make up the delay network for the circuit. The delay network can also be represented as a complete bipartite graph by using the critical path lengths as the edge weights for the graph.

A small complete delay network for a circuit becomes most important when hierarchical design methods are used in designing ICs. Hierarchical design methods, such as the structured-design methodology are commonly used to make the design of large VLSI circuits more manageable. A typical structured-design methodology partitions a design into several levels of hierarchy, enabling designers to focus on one particular level of the hierarchy at a time. For example, a digital VLSI circuit design could consist of many functional blocks which are composed of many simpler functional blocks which in turn are composed of simpler functional blocks, and so on down to the transistor level. Having delay networks for all of the separate functional blocks enables one to change one of the functional blocks and regenerate the delay network for only that particular functional block. This is preferable to regenerating the delay network for the whole design. Also, having small representations of the delay networks decreases the amount of computer memory that must be used to store the delay networks. Being able to store all of a circuit's delay networks in main memory as apposed to virtual memory would allow faster manipulation of the delay networks. This would decrease the time required to simulate the timing behavior of an entire design.

Considering the increasing size of ICs, and therefore the increasing size of delay networks, it is important to optimize the way such delays are represented.

U.S. Pat. No. 5,535,145, "Delay Model Abstraction" (issued Jul. 9, 1996 to Hathaway et al), which is herein incorporated by reference, addresses one method of reducing the storage associated in using delay graph abstraction. It reduces edges of the original delay network by marking those edges which contribute to delay paths and removing those that are unnecessary, if and only if they contribute to reducing edges in the final merged delay graph.

In a paper by Kobayashi, Noriya, and Sharad Malik. "Delay Abstraction in Combination Logic Circuits." IEEE International Workshop on Logic Synthesis (1995), which is herein incorporated by reference, the authors present heuristic algorithms to minimize delay networks. The algorithms work by applying simple transforms to local sections of a delay network in an attempt to minimize the delay network. There are two main transformation rules used in the heuristic algorithms. This approach involves repeatedly applying simple transform rules to a delay network using either the original delay network or the complete bipartite graph delay network.

The problem with both approaches is that from a computational standpoint for complex circuits with many inputs and outputs it can take a long time to process and yet still not achieve delay network description that is truly optimized.

So what is needed is an approach that is both faster and yet can be used with other approaches to produce a delay network that is closer to the minimum size delay network capable of representing a circuit.

SUMMARY OF THE INVENTION

The approach of this invention breaks a bipartite delay network into many two input delay networks. Then based on a set of rules the modelling system forms the optimum internal vertices called "hubs" for each of these two input delay networks.

The modelling system then uses these hubs to create a list of possible hubs for the entire delay network, from largest to smallest, omitting hubs which are subsets of larger hubs. Then the system goes through the list from largest hub to smallest selecting hubs and reorganizing the list each time a hub is chosen by removing paths which conflict with the chosen hub from unselected hubs. The selected hubs are inserted into the delay network, removing any edges they replace.

The result is a minimized delay network representation produced more efficiently then prior methods. Further processing may be required using the resulting hubs as inputs. This is to determine whether there are any more hubs that can be introduced between the last set of hubs created and the output. In addition, this method can be combined with the Kobayashi and Malik method to produce an even smaller delay network representation in less time than Kobayashi and Malik alone.

BRIEF DESCRIPTION OF THE DRAWINGS

FIG. 8 shows the output difference matrices for the MEDD instance in FIG. 6.

3

Figure 6:
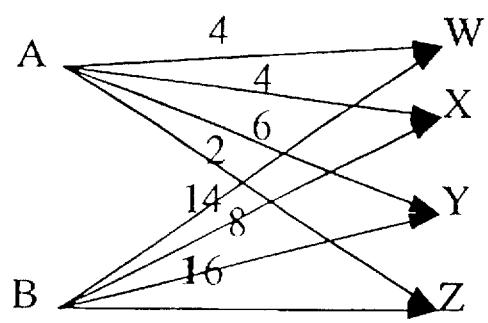
FIG. 6 illustrates a 2×4 MEDD instance.

FIG. 9 shows the input difference matrices for the MEDD instance in FIG. 6.

Figure 10:
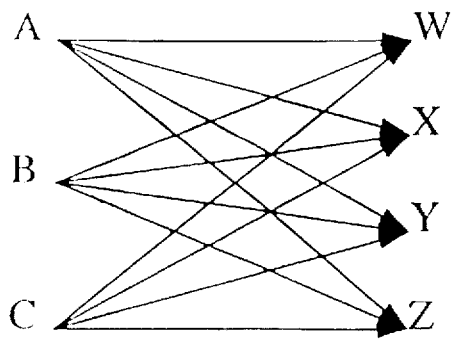

FIG. 10 illustrates a 3×4 MEDD instance.

Figure 11:
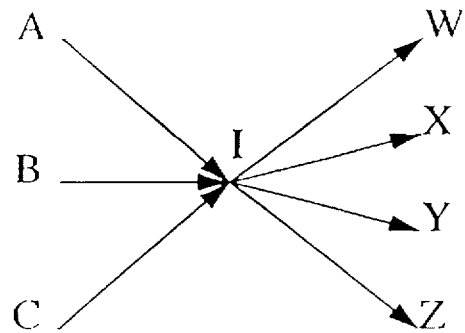

FIG. 11 illustrates a 3×4 MDAG.

Figure 12:
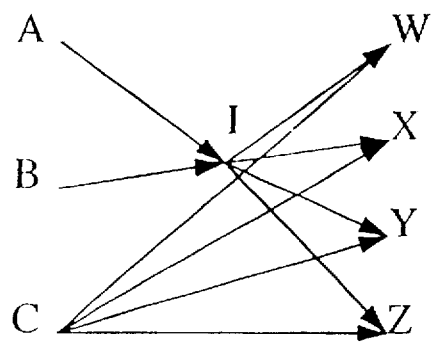

FIG. 12 illustrates a 3×4 MDAG which is not a MPDAG.

Figure 13:
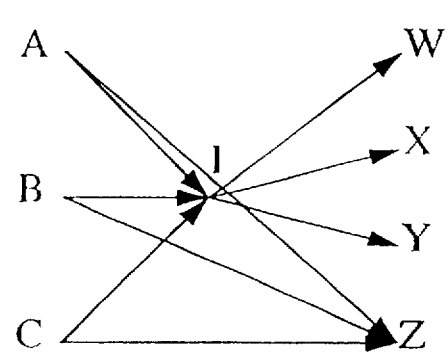

FIG. 13 illustrates a 3×4 MDAG which is not a MPDAG.

Figure 14:
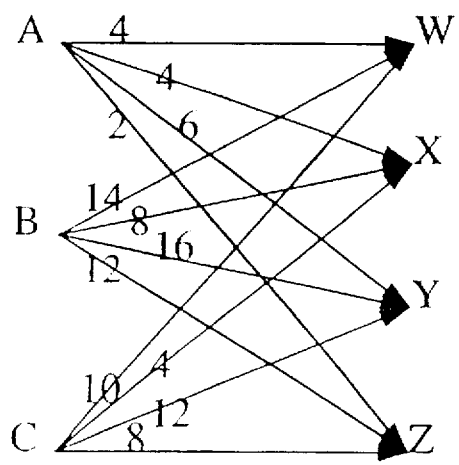

FIG. 14 illustrates a 3×4 MEDD with path legnths assigned to its edges.

Figure 15:
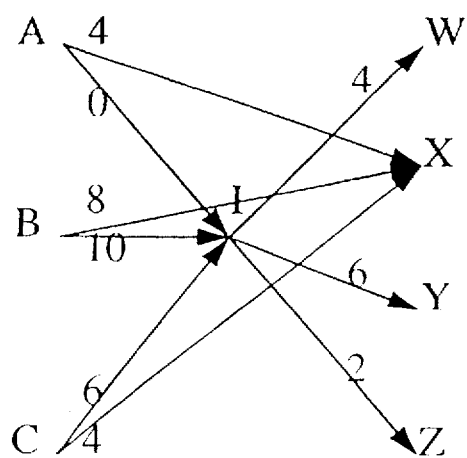

FIG. 15 illustrates a for a 3×4 MDAG.

FIG. 16 shows the output difference matrices for the MEDD instance in FIG. 14.

Figure 17:
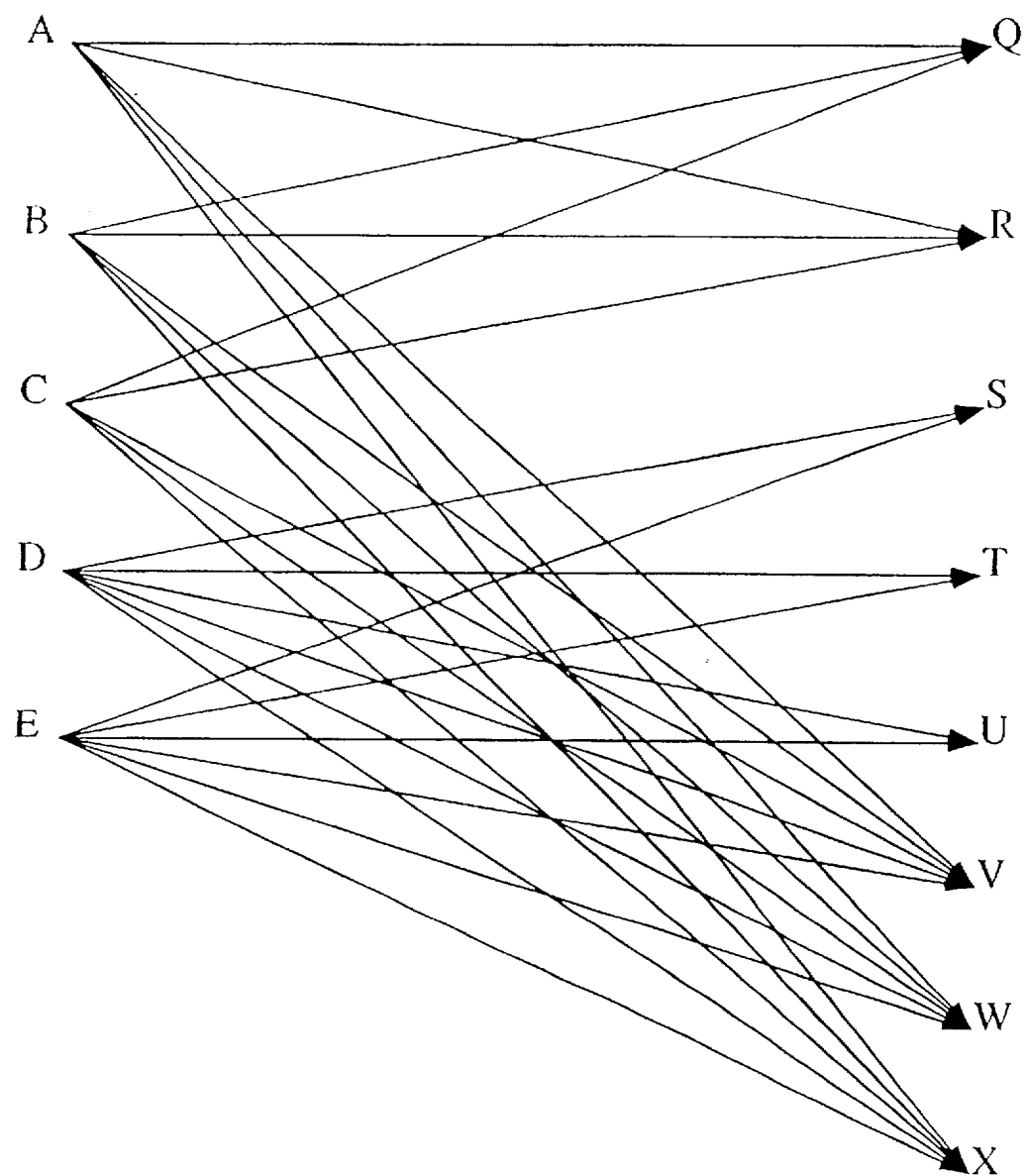

FIG. 17 illustrates a a 5×8 MEDD instance.

Figure 18:
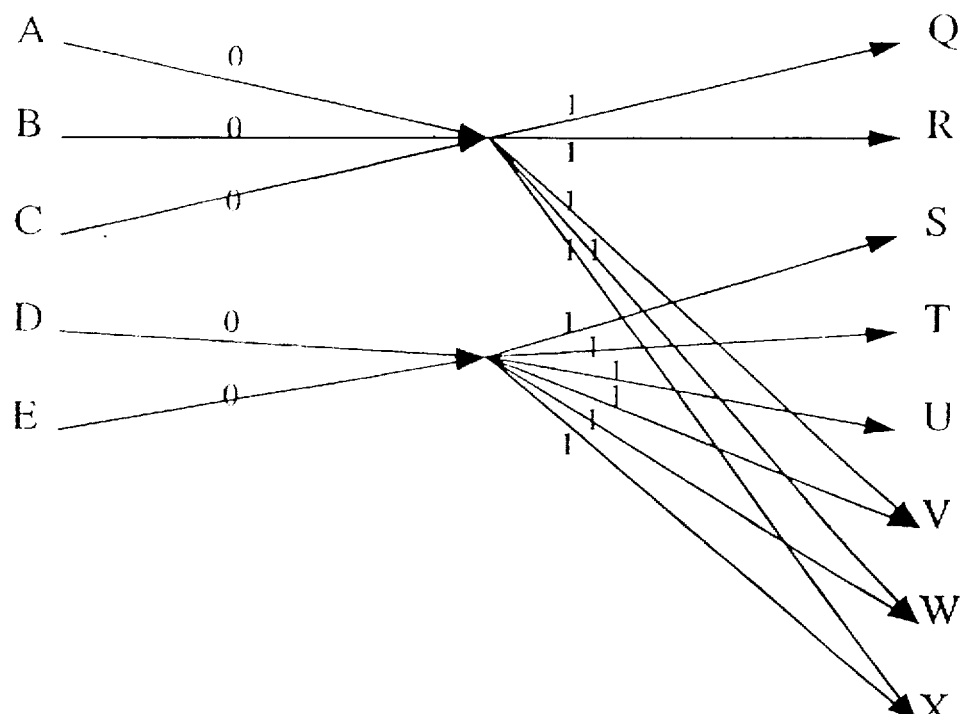

FIG. 18 illustrates a DAG for the MEDD instance in FIG. 17.

Figure 19:
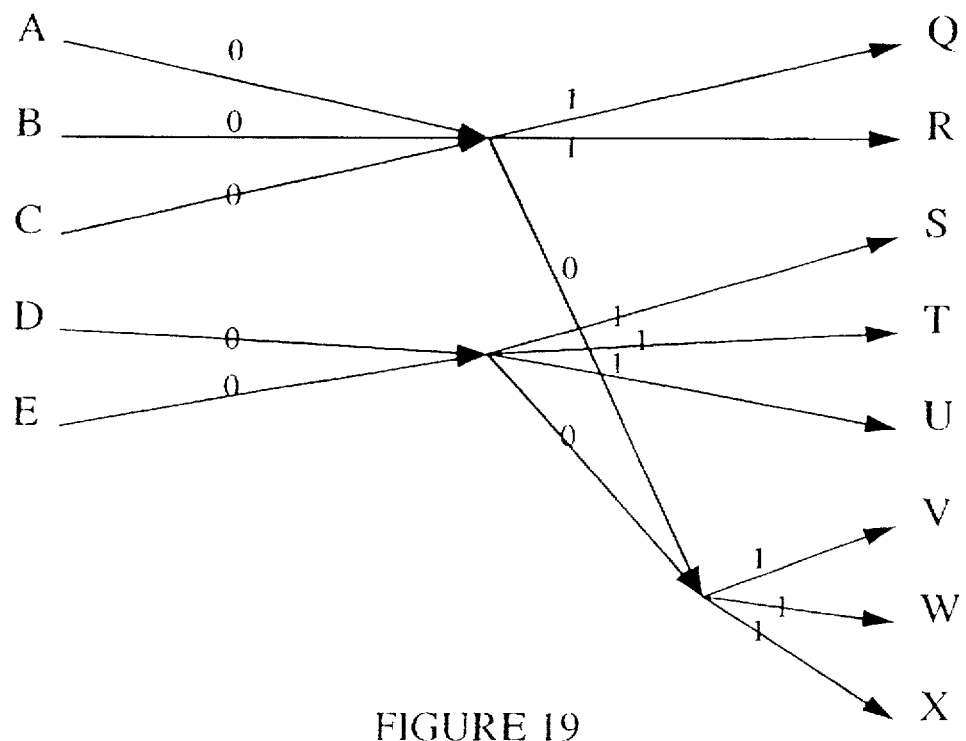

FIG. 19 illustrates a MDAG for the MEDD instance in FIG. 17.

Figure 20:
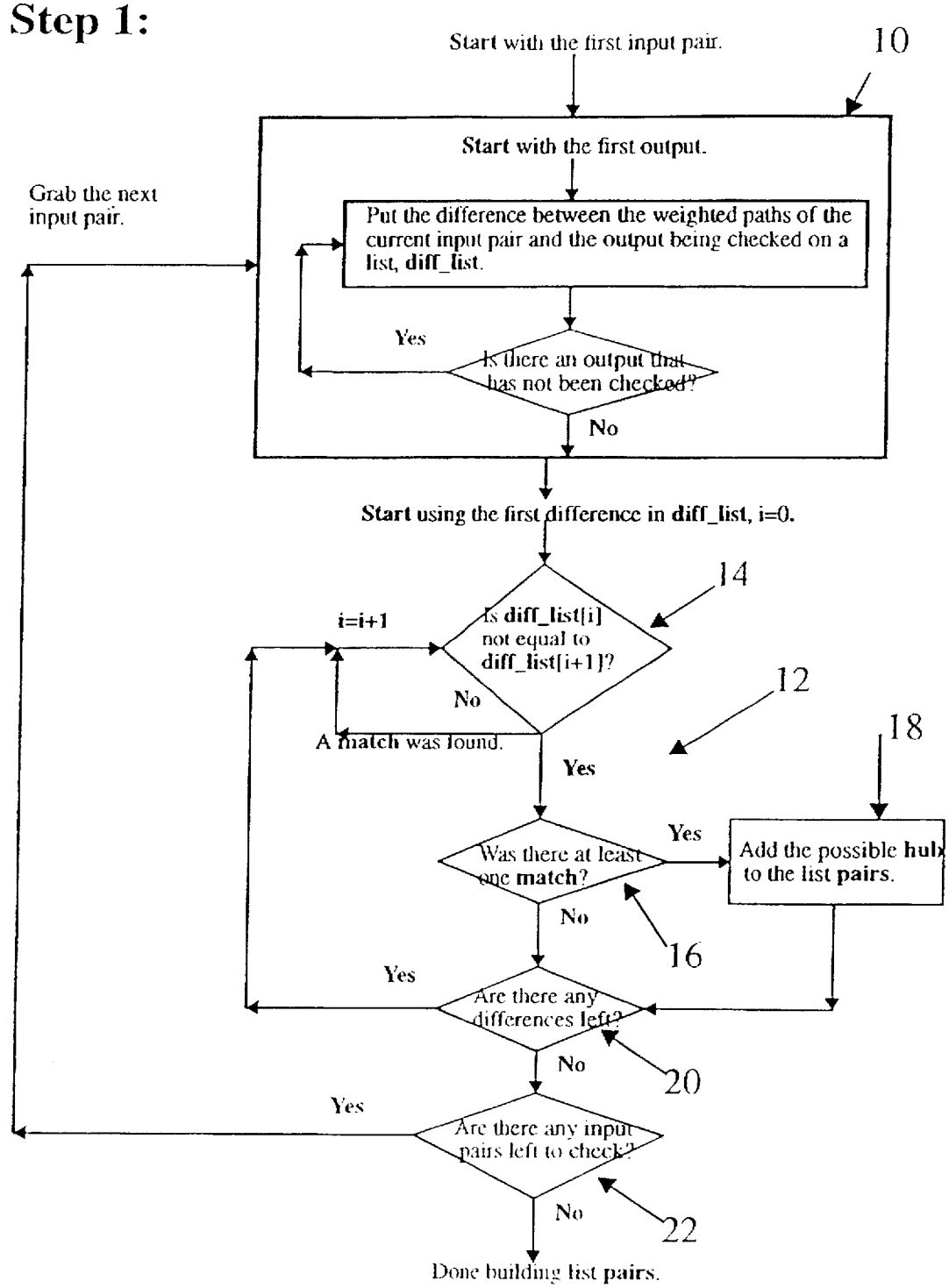

FIG. 20 is a flow chart for a first set of process steps for one embodiment of this invention.

Figure 21:
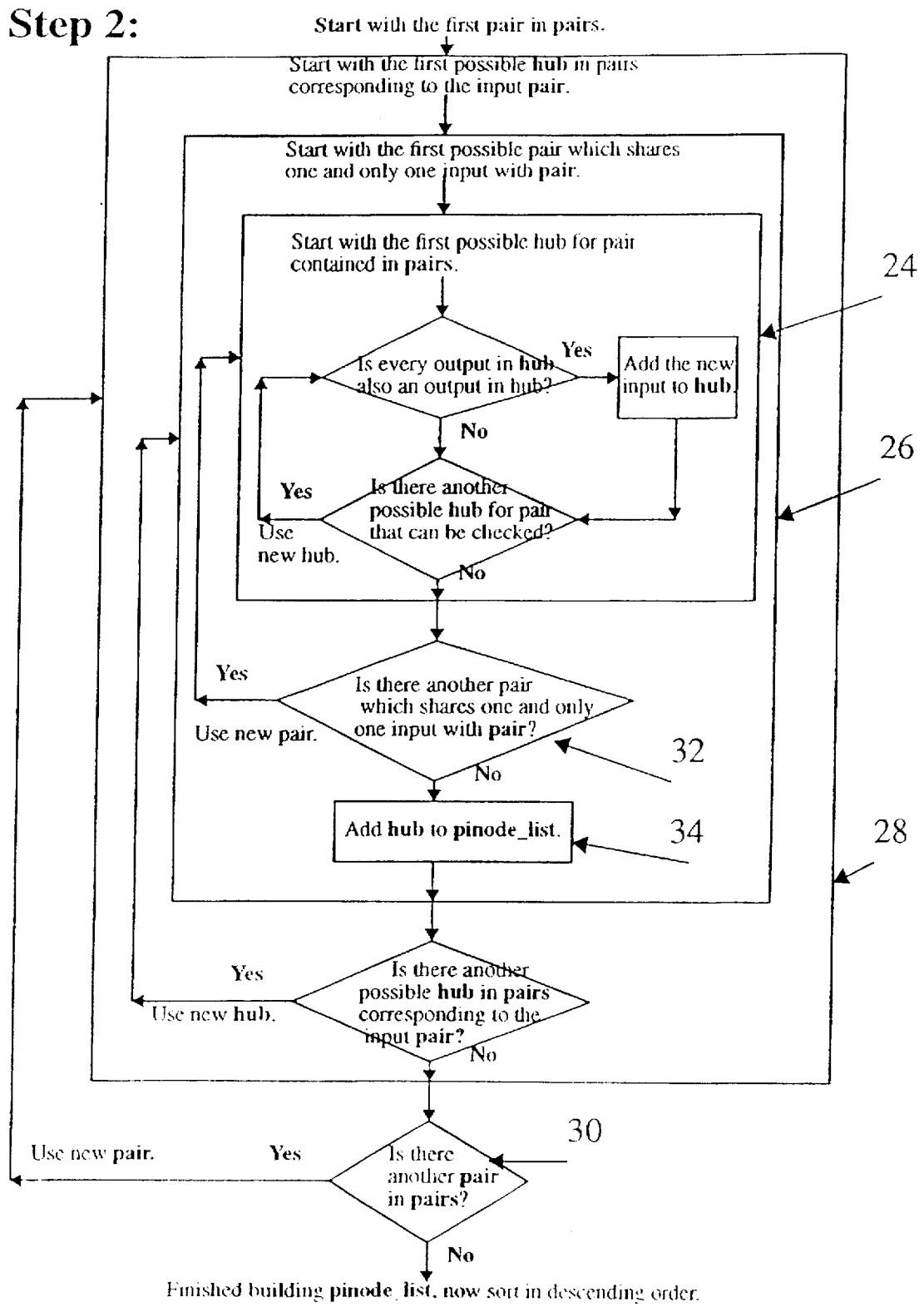

FIG. 21 is a flow chart for a second set of process steps for one embodiment of this invention.

Figure 22:
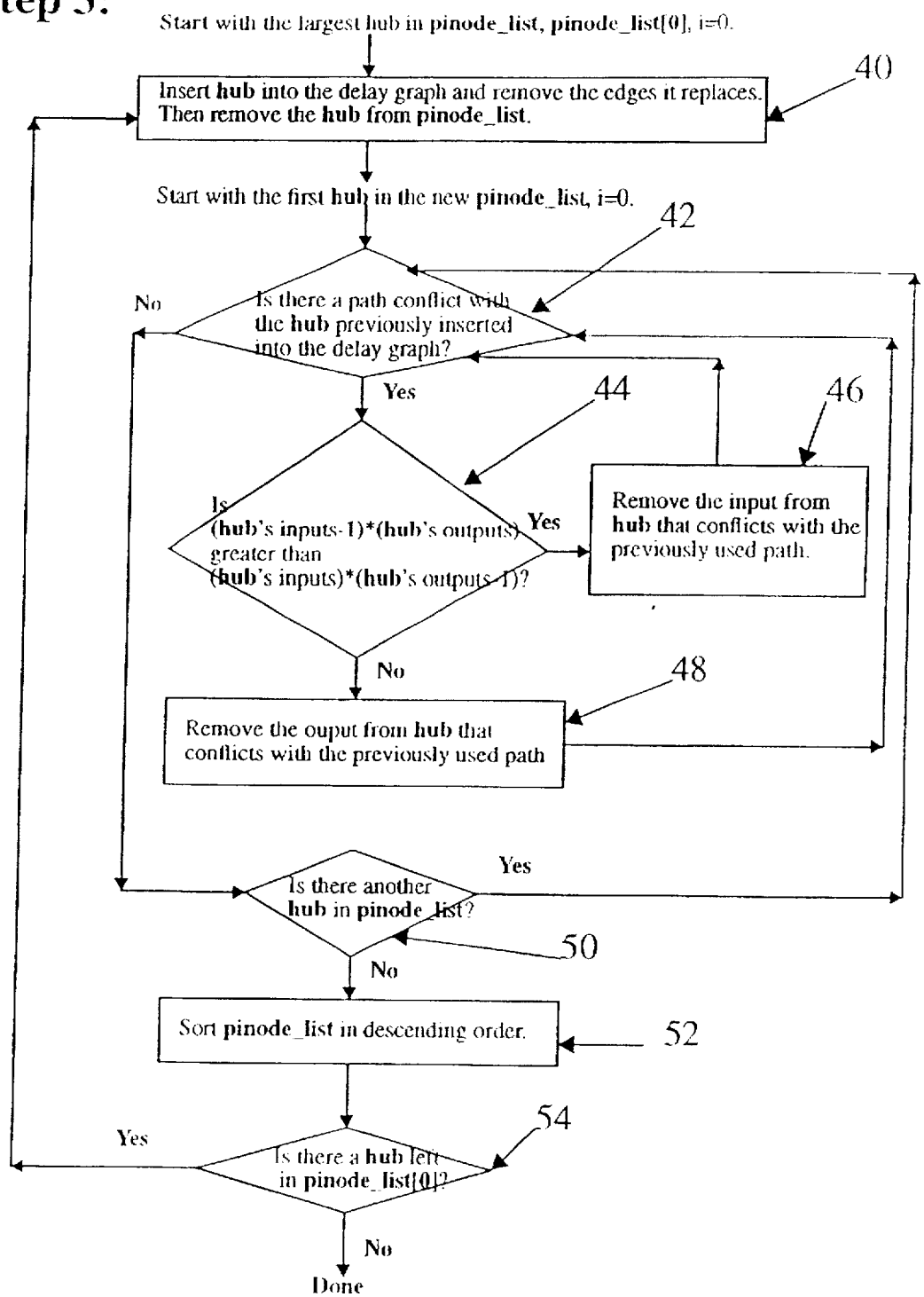

FIG. 22 is a flow chart for a third set of process steps for one embodiment of this invention.

Figure 23:
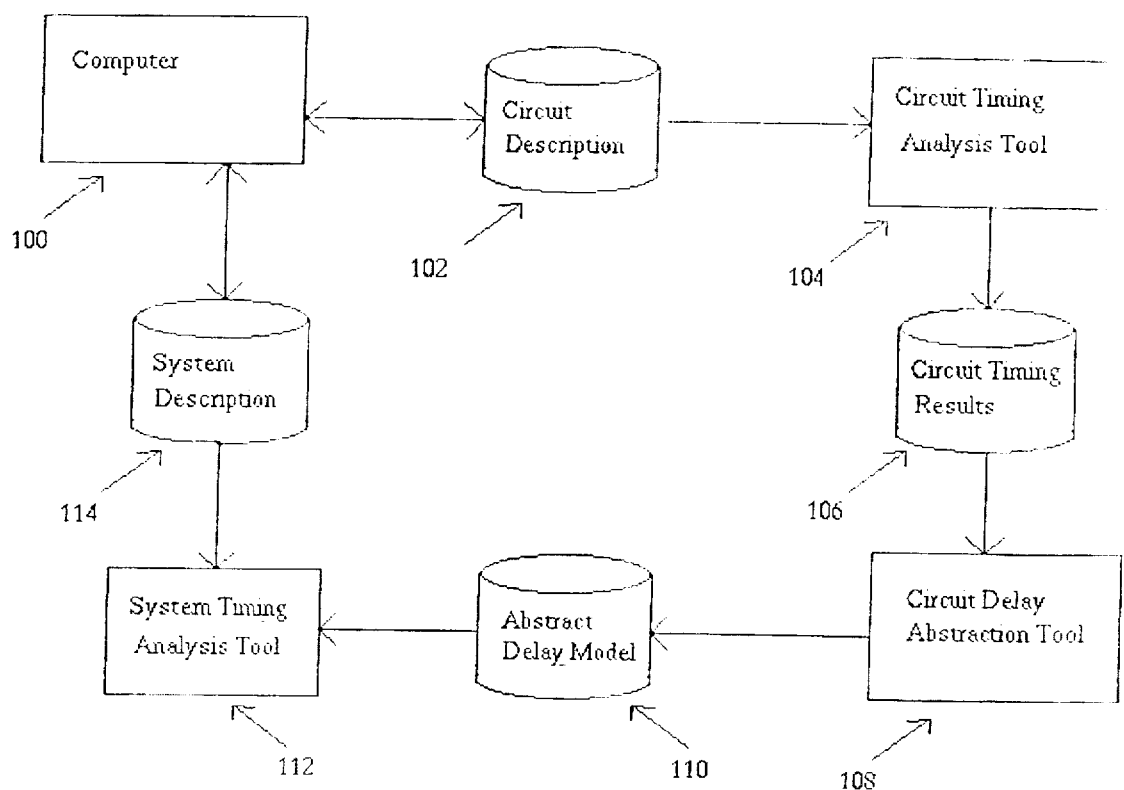

FIG. 23 is a schematic block diagram of the components of a system according to this invention.

FIG. 24 is example script for use with SIS.

DETAILED DESCRIPTION OF THE INVENTION

A delay network, which preserves the topology of a combinational logic circuit, can be created by representing each logic gate with a weighted vertex. The size of the resulting delay network is unbounded with respect to the number of its inputs and outputs. A complete bipartite graph representation of this delay network allows fast access to the information. However, we shall see that for large combinational logic circuits, this representation is rarely the most space efficient method of storing the delay network.

Figure 4:
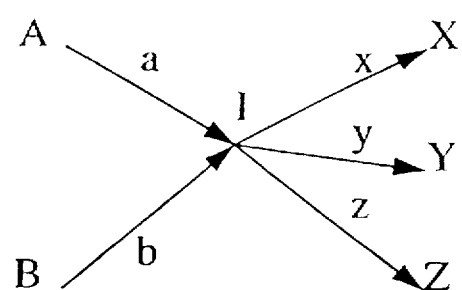
FIG. 4 illustrates a 2×3 MDAG.

It is often possible to reduce the number of edges in the complete bipartite graph representation by the introduction of an internal vertex, allowing different paths to share edges. We will call this vertex and its incident edges a hub. This is illustrated in FIG. 4 where the hub is shown as I. The resulting delay network even with the introduction of hubs is still a directed acyclic graph, or DAG.

The smallest possible graph capable of representing a delay model of a combinational logic circuit is what we call a minimum directed acyclic graph or MDAG. Topologically, the (number of inputs)×(number of outputs) is an upper bound on the number of edges and (number of inputs)+ (number of outputs) is a lower bound, provided each path is of finite length, and hence the graph is connected. The topological representation of the lower bound DAG (not taking into account any possible weight) is called the minimum possible directed acyclic graph, MPDAG.

The quest for an effective process or system for finding the MDAG begins with an analysis of the problem which we call MEDD or the Minimum Equivalent Delay Digraph problem.

Stated as a decision problem we have:

INSTANCE: D joint sets N (set of all inputs), N (set of all outputs) and function f: N×M →Reals or Infinity, and integer K.

QUESTION: Does there exist a DAG, G, with vertex set containing N and M such that the path distance W(u,v) in G for each u ∈M is f(u,v) and such that it possesses K or fewer edges. In addition, each path must be unique.

Figure 1:
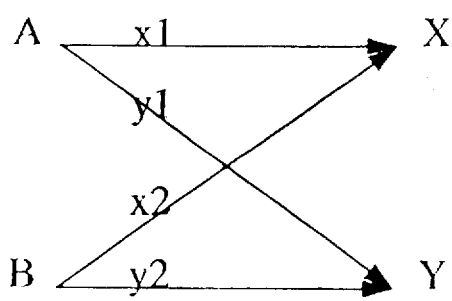
FIG. 1 illustrates a 2×2 MEDD instance.
Figure 2:
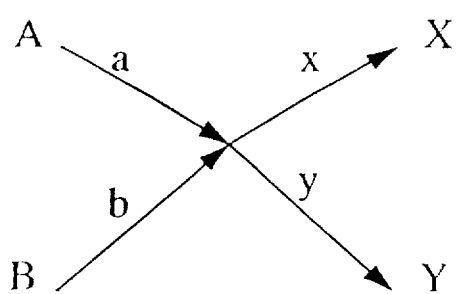
FIG. 2 illustrates a 2×2 MDAG.

We first consider the case when |N|=2 and |M|=2. A complete bipartite weighted digraph for an instance of MEDD with |N|=2 and |M|=2 is given in FIG. 1. As in FIGS. 1 and 2, for this instance of MEDD the complete bipartite graph also represents the 2×2 MPDAG. However, in this instance it is sometimes possible to create another MPDAG with a different configuration by introducing a new vertex. We define an internal vertex, to be a vertex with in-degree greater than 1 and out-degree greater than 1. This 2×2 MPDAG is shown in FIG. 2. The internal vertex resulting in FIG. 2's 2×2 MPDAG may only be introduced when the path distances between the inputs and outputs can be preserved. This condition requires that the following equations hold:

$$a+x=x1 \quad a+y=y1$$

$$b+x=x2 \quad b+y=y2$$

Simple algebra reveals:

$$x1-x2=y1-y2 \tag{EQJ}$$

Therefore, an internal vertex may only be introduced when EQ1 is satisfied.

We define an internal vertex, as a vertex with in-degree greater than 1 and out-degree greater than 1. The restriction to in-degree of 2 is natural, as the following principle shows:

Principle 1: If G' is a MDAG, then G' has no internal vertex with in-degree 1 nor any internal vertex with out-degree 1.

Figure 3:
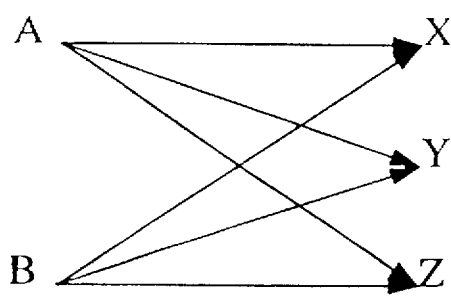
FIG. 3 illustrates a 2×3 MEDD instance.

The complete bipartite graph for an instance of MEDD with |N|=2 and |M|=3 is given in FIG. 3. In the interest of improving readability, the weights on the edges of this complete bipartite graph, as well as the complete bipartite graphs that will follow, have been removed. One may assume that the weight on each of the edges in these graphs represents the delay a signal encounters between its application on the input and its appearance at the output. This is the first instance of MEDD we have examined where the complete bipartite graph is not the MPDAG, although it could be the MDAG. For example, in some cases one may add an internal vertex, I, resulting in the 2×3 MPDAG shown in FIG. 4. This is the only possible DAG which may satisfy the problem instance and contains fewer edges than the complete bipartite graph. This leads us to the following principle:

Principle 2: The |N|×|M| MPDAG, for |N|>1, |M|>1, and |N|+|M|>4 possesses |N|+|M| edges, and consists of a single internal vertex, I, with edges from all inputs to I and from I to all outputs.

The internal vertex introduced in FIG. 4 may only be introduced when the path distances between the inputs and outputs can be preserved. This condition requires that the following equations hold:

$$a+x=W(A,X) \quad a+y=W(A,Y) \quad a+z=W(A,Z)$$

$$b+x=W(B,X) \quad b+y=W(B,Y) \quad b+z=W(B,Z)$$

where W(A,X) represents the path distance from input A to output X, and a,b,x,y,z represent the edge weights in FIG. 4. Simple algebra reveals a linear dependency among the path lengths, as in EQ1, which must hold in order to introduce an internal vertex that will result in the MPDAG:

$$W(A,X)-W(B,X)=W(A,Y)-W(B,Y)=W(A,Z)-W(B,Z)$$

We may now present Principle 2, which presents the requirements for forming the MPDAG for any two input instance of MEDD.

Principle 2: The MPDAG for a particular 2×|M| MEDD instance is realizable if and only if the following equation holds:

$$W(A,i)-W(B,i)=W(A,j)-W(B,j), \forall i,j \in M \quad (EQ2)$$

where {A,B} is the set of inputs, M is the set of outputs, and where W(A,i) and W(B,i) represent the weights on the edges from inputs A and B to output i.

Of course, it is possible that a MDAG with an edge savings over the complete bipartite graph exists even if EQ2 does not hold for all M. All that is required to realize an edge savings over that of the complete bipartite graph for a 2X|M| MEDD instance, is that there exists at least one set of at least three outputs in the MEDD instance that satisfies the linear dependency given in EQ2. If each of these sets was considered as a separate instance of MEDD, Principle 2 would allow each to be represented by the MPDAG. Therefore, we can replace each section of the complete bipartite graph represented by one of these sets, with the respective MPDAG for the set. We are now in a position to properly define a hub. A hub is the MPDAG for a subset of the inputs and outputs of a MEDD instance. Throughout the rest of this specification we will denote a hub of a DAG G as:

$$G\{(I1, I2, \ldots, IK) \times (O1, O2, \ldots, OL))\}$$

where I1 to IK are the inputs of the hub and O1 to OL are the outputs of the hub.

Figure 5:
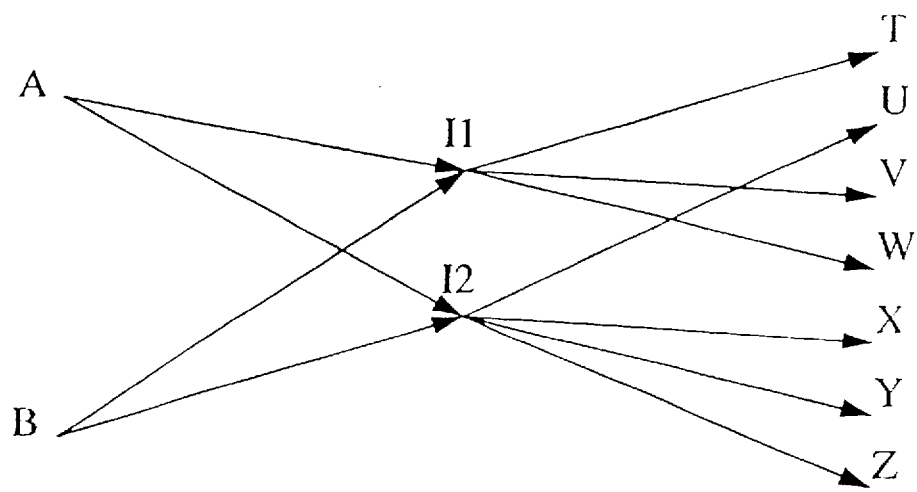
FIG. 5 illustrates a 2×7 MDAG with two hubs.

Complicating matters, an MDAG with six or more outputs could have more than one hub, see FIG. 5 (which could be represented as G{((A,B),(T,V,W)),((A,B),(U,X,Y,Z))}). One may notice that applying EQ2 to all combinations of the outputs and creating hubs where appropriate, will yield a DAG with only one possible level of internal nodes.

Principle 3: Given a 2×|M| instance of MEDD, then there exists a MDAG that has either 0 or 1 internal layers. There is a much faster way of finding the MDAG for a MEDD problem instance with two inputs than checking all possible combinations of outputs with EQ2. In fact, the 2×|M| MDAG can be found in polynomial time as demonstrated in the following example:

FIG. 6 is a |N|=2, |M|=4 instance of MEDD. To find the MDAG we can first build a 2×2 matrix for each output o in M. Each entry will be the difference between the path lengths: W(i,o) and W(j,o), where i is the input on the horizontal, j is the input on the vertical, and o is the output for the matrix in question. The matrices for the MEDD instance in FIG. 6 are shown in FIG. 8.

The matrices are always skew symmetric (negative mirror images of themselves across the diagonal). We only need to be concerned with the upper right or lower left position. To allow the creation of a hub, a common difference must occur at least three times. One can see that $-10$ occurs for matrices W, Y, and Z in the lower left position. This requires that:

$$W(A,W)-W(B,W)=W(A,Y)-W(B,Y)=W(A,Z)-W(B,Z)=-10$$

Figure 7:
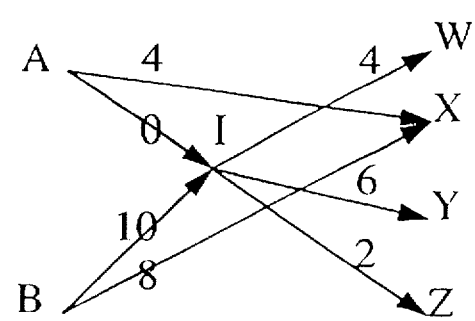
FIG. 7 illustrates a 2×4 MDAG.

This satisfies EQ2, for the M subset W, Y, and Z. From this information we can draw the MDAG in FIG. 7. This method can be used to find the MDAG for any 2×|M| instance of MEDD. The algorithm follows:

1. Make a list of all the common differences that occur more than two times.

2. For each difference in the list:
   a. Create an internal node.
   b. Connect the two inputs to it.
   c. Connect the internal node to all the outputs that share the difference.
   d. Remove the old pathways to these outputs.

The above approach works in polynomial time and for any number of outputs. The C program below creates an array of each difference along with its corresponding output. The difference__list__2×M algorithm provides a list of input differences used in the circuit delay abstraction system and method of this invention.

```
#define A 0
#define B 1
difference__list__2xM(M,f)
int M;              /*M is the number of outputs.*/
double f[2][M];     /*f[ ][ ] is the distance function.*/
{
    for(i = 0; i < M;i++) {
        difference__list[i].destination = i;
        difference__list[i].value = f[A][i] - f[B][i];
    }
    qsort(difference__list,M,sizeof(difference__list[0]),
    value__cmp__function);
}
```

Principle 2 can be modified for the case when there are more than two inputs, giving us the following principle:

Principle 4: The MPDAG for a particular |N|×|m| MEDD instance is realizable if and only if the following equation holds:

$$W(a,i) - W(b,i) = W(a,j) - W(b,j) \quad \forall a \in N, b \in N, \forall i \in M, j \in M. \quad (EQ3)$$

If the path delays are to be preserved then:

$$W(a,i) = W(a,I) + W(I,i), \quad \forall a \in N, \forall i \in M.$$

Finding the MDAG for |N|>2 is more complicated than in the |N|=2 case, as demonstrated by the 3×4 MEDD instance shown in FIG. 10. On the other hand, the potential savings are much greater, making it even more attractive to find the MDAG or a configuration which is approximately the same size. In the 3×4 MEDD instance (FIG. 10), the MPDAG (FIG. 11) results in an edge savings of 5 edges or a 41.6% reduction in the number of edges required to represent the 3×4 MEDD instance over that of the complete bipartite graph.

As with the previous case for the |N|=2 instances of MEDD, the MDAG does not have to be the MPDAG to realize a substantial edge savings. If the 3×4 MEDD instance in question does not satisfy EQ3, a subset of its inputs and outputs may satisfy EQ3, thereby enabling one to create one or more hubs. One example is FIG. 12, where EQ3 is satisfied for inputs A, B and outputs W, X, Y, Z. This enables us to replace the complete bipartite graph connecting inputs A, B to outputs W, X, Y, Z with hub G{((A,B),(W,X,Y,Z))} which saves 2 edges over the complete bipartite graph representation of the delay network. Another example is in FIG. 13, where EQ3 is satisfied for inputs A, B, C and outputs W, X, Y and the hub G{((A,B,C),(W,X,Y))} has been introduced. This DAG saves 3 edges over the complete bipartite graph representation of the delay network.

The following example attempts to find the MDAG in the same fashion used in the previous section to find the MDAG for the |N|=2 case. FIG. 14 shows a 3×4 MEDD instance with path lengths assigned to the edges.

In an attempt to find the MDAG for this MEDD instance, we construct the difference matrices for the outputs as we did for the |N|=2 case. This results in the matrices shown in FIG. 16. By circling the reoccurring groups of differences, we can see which input-output sets can be replaced by a hub.

One can see that −4 occurs at the (B,C) intersection for each matrix. This requires that:

$$W(B,W) - W(C,W) = W(B,X) - W(C,X) =$$
$$W(B,Y) - W(C,Y) = W(B,Z) - W(C,Z) = -4$$

which satisfies EQ3 for the input subset B, C and all of the outputs. This allows us to replace the input-output set ((B,C),(W,X,Y,Z)) with the hub G{((B,C),(W,X,Y,Z))}. Allowing us to build a DAG with an edge savings of 2 over the complete bipartite graph representation.

Unfortunately, taking the single differences that occur most often and replacing them with hubs as in the |N|=2 case will not always yield the MDAG when |N|>2. Even in this particular instance it can be seen that more edges could be saved if we looked for groups of difference that the matrices have in common. For example, the W, Y, and Z matrices share a common group of differences among the A, B and C inputs, which is circled in gray (FIG. 16). This common group of differences requires that EQ3 is satisfied for inputs A, B and C as well as for outputs W, Y and Z. This allows us to replace the input-output set ((A,B,C),(W,Y,Z)) with the hub G{((A,B,C), (W,Y,Z))}. Construction of the MDAG with the new hub (FIG. 15), results in a savings of 3 edges over the complete bipartite graph representation.

Finding the MDAG using difference matrices now suggests that one must look at all the arrangements of all the groups of common differences to find the MDAG. This is because the transformation of one group to a hub could preclude the transformation of another group to a hub. In the above example, we chose to transform the group circled in gray into a hub. This nullified any advantage of transforming the group circled in black into a hub because pathways from inputs B, C to outputs W, Y, Z had already been created.

To complicate matters further, the above approach only considers 1 possible level of internal nodes. According to Principle 3, this is correct for |N|=2. Unfortunately, as the following example demonstrates, the MDAG for |N|>2 may have 2 or more layers. Consider the 5×8 MDAG in FIG. 17 and assume that the weight on each edge is one. The output difference matrix approach would give FIG. 18 as the MDAG, yet FIG. 19 has fewer edges and represents the same delay network.

We now apply these principles to create the process and system for obtaining the reduced delay network of this invention.

In summary this is how it is done.

1. Apply difference__list__2×M to every pair of inputs.
2. For each pair of inputs, use its difference list to form a list of all the hubs in that input pair's MDAG. For each pair, store the total number of edges that can be saved over the complete bipartite graph delay network representation by introducing the hubs.
3. Sort the pairs of inputs according to the number of edges saved in each pairing of inputs.
4. For each pair of inputs, cycle through each one of it's hubs. For each one of these hubs, cycle through the hubs for every other possible pair. For each hub found which shares one and only one of the former hub's inputs and all of the same outputs as the former hub, add it to the new hub. This results in a list, pinode__list, containing the maximum hub for each input combination. Sort this list according to decreasing order of edges saved by introducing each hub.
5. For each hub in pinode__list, if a hub does not conflict with a previous hub that has been selected, then select it. After a hub has been selected, go through the remaining unselected hubs and remove all conflicts with the selected hub according to the following algorithm: Sort the hubs inputs and outputs according to descending order of conflicts with previously selected hubs. Search through each input-output pair, and remove the pin which has the greatest number of conflicts and is of the type which will result in the largest edge savings.
6. Take the list of selected hubs, pinode__list, and build the adjacency list.
7. When we run out of hubs to add to the new delay network, add edges from the inputs to the outputs, as necessary to preserve the connectivity and path weight of the old delay network.

FIGS. 20, 21 and 22 present a detailed flow chart of the process described above.

FIG. 20 generally illustrates how the set of optimum pairs are built according to this invention. FIG. 20 at 10 is filling the array diff__list with the weighted differences between the paths from the current input pair and the output being checked. In the lower part of FIG. 20 referred to generally as 12, the list of possible hubs in each pairs MDAG is linked to its list of input pairs. At step 14 possible hubs are being determined by examining diff__list. If a match is found the system cycles through to determine additional matches. If there is at least one match the possible hub is added to the list of pairs at 18. The process continues until all the differences are examined at 20 and there are no more input pairs that require checking (22).

FIG. 21 illustrates the building of a list of maximum hubs for each input combination referred to as the pinode__list in descending order. In the inner box 24 the system is cycling through a pair's hubs to determine whether additional inputs can be added to a new hub. It does this by determining whether there is another pair which share one and only one input with a first hub as shown in middle box 26. If there is no longer any more pairs that share one and only one input the hub is added to pinode__list at 34. The system then continues cycling thorough hubs in the pairs list (outer box 28) until there are no longer any hubs in the pair's list corresponding to the input pair. Finally this process continues cycling at 30 until there is no longer another pair in the pairs list. The resulting list of hubs is called pinode__list.

FIG. 22 illustrates how selected hubs are selected and edges removed. At 40 the largest hub from pinode__list is inserted into the delay graph (or alternatively a new delay graph is formed) and the edges it replaces are removed. After a hub is selected the system at 42 determines if there is a conflict with any of the remaining hubs. If a conflict is present the conflict is removed according to the algorithm at 44. Depending on the result either an input is removed at 46 or an output at 48. This continues until the process reaches the last hub in pinode__list. If at 50 there are no longer any hubs requiring conflict removal the unselected hubs are sorted at 52. The process continues until all the hubs pinode__list are removed or selected and inserted into the delay graph. (If a new delay graph is formed the original delay graph must be checked for any inputs and outputs which do not contain hubs and those paths must be inserted in the new delay graph).

This produces a delay network with only one layer of internal nodes or hubs. To insure that there are no longer any other possible layers of hubs which will yield edge-savings the program can be rerun using the last layer of hubs as inputs. For example, MEDD instance shown in FIG. 17 would transform the delay network to that shown in FIG. 18 if the program were run at only one layer. However, if the system rerun the delay network of FIG. 18 using the last layer of hubs as inputs the result would be the MDAG shown in FIG. 22. For a very complex circuit there may be further layers. So the delay abstraction tool of this invention could be rerun using the last layer of hubs as inputs until there are no further reductions in the size of the delay graph.

Appendix A is pseudo code written in C for implementing the features described above. The actual timing analysis tool used to implement the invention was SIS (a system for Sequential circuit Synthesis). SIS is an interactive tool for synthesis and optimization of sequential circuits which is available from the University of California at Berkeley. It takes a logic-level description of a sequential circuit and produces an optimized netlist in the target technology while preserving the sequential input-output behavior. However, the invention can be implemented on other tools available for timing analysis such as Einstimer, a timing tool licensed by IBM.

In FIG. 23 is referred to generically as Circuit Timing Analysis Tool 104. SIS and programs like it use Circuit Descriptions 102 stored in computer memory as inputs. These tools find the longest paths in Circuit Description, and print these results to an ASCII file. Circuit Description 102 is a file in memory written in ASCII text written in language such as Verilog VHDL, BLIF or SLIF for the circuit or circuits undergoing analysis.

SIS may be run interactively, or it may be passed a script which it will execute. FIG. 24 shows a sample script of SIS which informs SIS to perform the following actions:

1) SIS reads into a computer 100 the circuit description 102 comprising a technology library minimal.genlib and a logic description of a combinational circuit called C432.blif.

2) SIS then creates a net list of a circuit which implements the logic description, C432.blif, in the technology specified in library minimal.genlib.

3) Based on this SIS calculates the delays for the netlist referred to as Circuit Timing Results at 106 in FIG. 23.

These circuit timing results are an ASCII file stored in computer memory that contain a listing of the longest delay from each input to each output of Circuit Description 102.

4) The next step is a call to rdnet which provides the Circuit Delay Abstraction Tool 108. The tool can be stored on any suitable program storage device readable by computer 100. Appendix A is rdnet in pseudo code form. How the system is actually coded could be dependent on the circuit and system timing analysis tools used to implement the invention.

The results are stored as Delay Abstraction Model 110 in computer memory. This is an ASCII file which contains a listing of the longest delay from each input to each output of Circuit Description 102 and differs from Circuit Timing Results 106 in that it is a smaller description of circuit timing behavior.

The Abstract Delay Model 110 can then be used as an input into System Timing Analysis Tool 112 in FIG. 23. Alternatively, this model can be used to accomplish further reductions in description size by using another circuit timing model abstraction model such as the one offered by Kobayashi and Malik. Results show that when the Kobayashi and Malik circuit delay abstraction approach is used after the tool described in this invention there is still large overall computational savings with generally smaller abstract delay models.

System Timing Analysis Tool 112 is a program which runs on computer system 100 and uses System Description 114 and the Abstract Delay Model 110 as an input. System Description 114 is a specification of the logical function of the total system, of which the original Circuit Description is a part. It is written in a language such as Verilog or VHDL and is stored as ASCII text.

The System Timing Analysis Tool 114 itself finds the longest paths in the System Description and prints this to an ASCII file. It functions the same way as the Circuit Timing Analysis Tool 108 but at a higher level of abstraction. Thus, SIS is capable of performing this function as well as other similar timing analysis tools available to the public.

Although this process and system was described in terms of circuit and system timing analysis, the techniques of this invention may be useful in other applications involving networks.

Although the invention has been described in relation to a specific implementation, other implementations, modifications, variations and extensions are within the scope of the invention. The invention is therefore not limited by the description contained herein or by the drawings, but only by the claims.

---

Appendix A
1995, 1996 IBM Corporation 1

```
/* ********************************************************************** *
The edge reduction procedure is invoked by calling reduced_delay_DAG, with
the critical path delay matrix.
/* ********************************************************************** */
/* Global variables used.
pairs;          /* Will hold a list of pairs, each pair will */
                /* hold a list of all the hubs in its MDAG. */
pinode_list;    /* Will hold the list of hubs containing the */
                /* maximum hub for each input combination. */
*root;          /* Points to the adjacency list storing the */
                /* delay representation of the network. */
int nnodes;     /* contains the number of nodes in root. */
int pi;         /* Number of primary inputs. */
int po;         /* Number of primary outputs. */
/* ********************************************************************** *
diff_list_2xM(lastInput,diff_list,A,B) {
    Fills the array, diff_list, with the differences between
    the path weight from input A to output i and input B to
    output i.
}
```

Appendix A
1995, 1996 IBM Corporation 1

```
* ************************************************************** */
int
diff_list_2xM(lastInput,diff_list,A,B)
int lastInput;
diff_node diff_list[];
int A;
int B;
{
    int i, diff_ct;
    diff_ct = 0;
    for(i=0;i < NumberofPrimaryOutputs;i++) {
        diff_list[diff_ct].dest = i;
        diff_list[diff_ct].value =
                        edgeWeight(A,root[lastInput+1+i].n_num) -
                        edgeWeight (B, root [lastInput+1+i].n_num);
        diff_ct++;
    }
    /* Sort diff_list in increasing order. */
    return(diff_ct);
}
/* ************************************************************** *
    optimumPairs (firstInput,lastInput,pairs,pair_ct) {
        Returns an array of lists(pairs), each sublist is a linked
        list with the first item being the input pair, and each
        proceeding item being a possible internal node. Each
        sublist makes up the MDAG (minimum directed acyclic digraph)
        for the input pair in question.
    }
* ************************************************************** */
int
optimumPairs (firstInput,lastInput,pairs,pair_ct)
int firstInput;
int lastInput;
pair *pairs;
int *pair_ct;
{
    int inputs, max_pinode=0, i, j, k, matches, diff_ct, savings;
    diff_node *diff_list;
    for (i=firstInput; i<lastInput;i++) {
        for(j=i+1;j<=lastInput,j++) {
            diff_ct = diff_list_2xM(lastInput,diff_list,i,j);
            for(k=0;k < diff_ct;k++) {
                if(diff_list[k].value != diff_list[k+1].value) {
                    if(matches > 0) {
                        /* Add the i,j input hub to the pairs[*pair_ct] list
                           along with the savings realized from the hub
                           (ie. ((2 * (matches+1)) - (2 + (matches+1)))). Also
                           add this savings to the savings variable which keeps
                           track of the savings realized by using all the hubs for
                           the current i,j input pair. */
                    }
                }
                else {
                    matches++;
                }
            }
            pairs[*pair_ct].savings = savings;
            *pair_ct = *pair_ct + 1;
        }
    }
    /* Sort pairs in decreasing order. */
    return (max_pinode);
}
/* ************************************************************** *
    init_pinode_list(inputs, pinode_list,pinode_ct,pairs,pair_ct) {
        For each pair of inputs (pairs), cycle through each one of
        it's possible hubs. For each one of these hubs, cycle
        through the hubs for every other possible pair. For each
        hub found which shares one and only one of the former hub's
        inputs and all of the same outputs as the former hub, add
        it to the new hub. This results in a list containing the
        maximum hub for each input combination (pinode_list).
    }
* ************************************************************** */
init_pinode_list(inputs, pinode list,pinode_ct,pairs,pair_ct)
int inputs;
pinode *pinode_list;
```

-continued

Appendix A
1995, 1996 IBM Corporation 1

```
int *pinode_ct;
pair *pairs;
int pair_ct;
{
  int *input_set, i, j;
  pair *ptr1, *ptr2;
  for(i=0;(i < pair_ct);i++) {
    ptr1 = pairs[i].n_pair;
    while(ptr1 != NULL) {
      input_set[0] = pairs[i].pins[0]
      input_set[1] = pairs[i].pins[1]
      if(/* no hub in pinode_list has input
        pairs[i].pins[0]and outputs ptr1->pins */) {
        for(j=0; (j < pair_ct);j++) {
          if(/* ptr1 and ptr2 have only one input in common*/) {
            ptr2 = pairs[j].n_pair;
            while(ptr2 != NULL) {
              if(/* every output.pin in ptr1 is also in ptr2 */) {
                /* Add the new input pin to input set */
              }
              ptr2 = ptr2->n_pair;
            }
          }
        }
        /* Add a hub with outputs ptr1->pins and inputs input_set to
           pinode_list, along with the savings the hub would yield over
           using a complete bipartite graph. */
      }
      ptr1 = ptr1->n_pair;
    }
  }
  /* Sort pinode_list in decreasing order. */
}
/* ************************************************************** *
  /* Main procedure */
  reduced_delay_DAG (matrix)
  float *matrix; /* Stores the critical path delays */
                 /* from each input to each output. */
  {
    do {
      1. Call optimumPairs to get pairs filled with the MDAGs
         (minimum directed acyclic graph) for each pair. The
         structure pairs will be sorted in descending order of
         the pairs with the most edge savings over the complete
         bipartite graph.
      2. Call init_pinode_list with pairs. This results in a
         list, pinode_list, containing the maximum hub for each
         input combination. This is sorted in decreasing order
         according to edge savings.
      3. Go through pinode_list, if a hub does not conflict with
         a previous hub that has been selected, then select it.
         Insert the hub into root and remove the edges it
         replaces. After a hub has been selected, go through the
         remaining unselected hubs and remove all conflicts with
         the selected hub.
    } while the # of edges in root are fewer than before this
      iteration.
  }
* ************************************************************** */
reduced_delay_DAG (matrix)
float *matrix; /* Stores the critical path delays from each */
               /* input to each output. */
{
  int firstInput,lastInput, edge_ct, temp_ct, inode_ct, inputs, pinode_ct=0,
    i, j, pair_ct=0;
  matrix_to_adj_list(); /* Creates an adjacency list from the delay matrix.
                           Sets root (a pointer to the adjacency list) and
                           the variable nnodes, the # of nodes in the list. */
  temp_ct = edgecount(root); /*Number of edges in root adjacency list. */
  firstInput =0;
  lastInput = pi - 1;
  do {
    edge_ct = temp_ct;
    optimumPairs (firstInput,lastInput,pairs,&pair_ct);
    inputs = lastInput - firstInput + 1;
    init_pinode_list(inputs,pinode_list,&pinode_ct,pairs,pair_ct);
    inode_ct=0;
```

-continued

Appendix A
1995, 1996 IBM Corporation 1

```
for(i=0;(1 < pinode_ct) && (pinode_list[i].savings > 0);i++) {
    /* Insert the hub specified by pinode_list[i] into root and remove
       the edges it replaces.
    inode_ct++;
    for(j=(i+1);j < pinode_ct;j++) {
        while( there are path conflicts with previously used hubs) {
            if(((*pinode_list[j].ipin_ct-1)*(*pinode_list[j].opin_ct)) >
                ((*pinode_list[j].ipin_ct)*(*pinode_list[j].opin_ct-1))) {
                /* Remove the input pin from pinode_list[j].ipins with the
                   largest number of conflicts with previously used hubs.*/
            }
            else {
                /* Remove the output pin from pinode_list[j].opins with the
                   largest number of conflicts with previously used hubs.*/
            }
        }
        pinode_list[j].savings =
                ((pinode_list[j].ipin_ct * pinode_list[j].opin_ct) -
                (pinode_list[j].ipin_ct + pinode_list[j].opin_ct));
    }
    /* Sort &(pinode_list[i+1]) in decreasing order. */
    }
    nnodes = inode_ct + lastInput + 1 + po;
    temp_ct = edgeCount(root);
    firstInput = lastInput +1;
    lastInput = nnodes - po - 1;
} while(edge_ct > temp_ct);
}
```

What is claimed is:

1. A computer implemented method for reducing the size of graph representations of circuit delay networks, comprising the steps of:
   obtaining a delay network representation for the circuit;
   generating a list of hubs for each possible input combination;
   inserting the hub with the largest possible edge savings into the delay network representation, removing any conflicts in the the list hubs not inserted into the delay network representation;
   continuing to insert hubs with the largest possible edge savings into the delay network representation until there are no longer any hubs to insert.

2. A method according to claim 1 wherein the step for generating a list of hubs further comprises omitting any hubs that are subsets of larger hubs.

3. A method according to claim 1 wherein the step for generating a list of hubs also comprises:
   cycling through each pair of inputs to obtain a first set of hubs;
   cycling through the first set of hubs for every other possible pair of inputs; and
   adding the inputs from hubs in the first set of hubs to the hubs generated when cycling through the first set of hubs for every other possible pair of inputs when each hub generated shares just one of the inputs for a hub in the first set of hubs and all of the same outputs, thereby creating a set of hubs for each possible input combination.

4. A method according to claim 1 wherein the step of inserting the hubs with the largest possible edge-savings also comprises:
   adding the inputs for the first set of hubs to the hubs generated when cycling through the first set of hubs for every other possible pair of inputs when each hub generated shares just one of the inputs for a hub in the first set of hubs and all of the same outputs, thereby creating a set of hubs for each possible input combination; and
   sorting the set of hubs created for each possible input combination in descending order of pairs of inputs with the largest possible edge savings.

5. A method according to claim 1 further comprising the additional step of running the computer implemented method for reducing the size of graph representations of circuit delay networks interactively using the circuit delay network representation produced during a prior iteration as the delay network representation for a circuit.

6. A method according to claim 3 further comprising the step of rerunning the process using the inputs of the hubs inserted into the delay network representation as input pairs.

7. A program storage device readable by the computer embodying a program of instructions executable by a machine which tangibly performs a method for reducing the size of graph representations of circuit delay networks, said method comprising the steps of:
   obtaining a list of pairs of inputs containing MDAG's for each pair;
   sorting the list of pairs of inputs in descending order of pairs with the most edge savings over the complete graph;
   cycling through each pair of inputs to obtain a first set of hubs for each input pair;
   cycling through each first set of hubs for every other possible pair of inputs;
   adding the inputs for the first set of hubs to the hubs generated when cycling through the first set of hubs for every other possible pair of inputs when each hub generated shares just one of the inputs for a hub in the first set of the hub and all of the same outputs, thereby creating a set of hubs for each possible input combination;
   sorting the set of hubs for each possible input combination in descending order of pairs of inputs with the largest possible edge savings;

selecting the hub with the largest possible edges saving by inserting it into the delay network representation and removing the edges it replaces;

removing any paths in the remaining unselected hubs that conflict with the previously selected hubs;

continuing the steps of selecting hubs and removing any paths in the remaining unselected hubs until there are no unselected hubs.

8. A computer implemented method for reducing the size of graph representations of circuit delay networks, comprising the steps of:

obtaining a delay network representation for the circuit;

generating a list of hubs for each possible input combination;

selecting the hub with the largest possible edge savings for placement into an abstracted delay network and removing any conflicts in the hubs remaining in the list;

continuing to select hubs with the largest possible edge savings until there are no longer any hubs to select.

9. A method according to claim 8 further comprising the step of adding to the abstracted delay network input and output paths containing no hubs.

10. A computer system for providing system timing analysis comprising:

a computer memory which stores circuit descriptions;

a processing system for accessing the circuit descriptions in computer memory for optimizing paths in the circuit descriptions by listing all possible hubs between inputs and outputs, and selecting hubs with the greatest potential for edge savings, and a computer memory for storing the path descriptors of the selected hubs after processing.

11. A computer system according to claim 10, further comprising a processing system which takes the circuit descriptions in computer memory and finds the longest paths in the circuit descriptions.

12. A computer system according to claim 10, further comprising a processing system which uses the path descriptors of the selected hubs to find the longest paths in a system description.

13. A computer system according to claim 10, further comprising a processing system for timing analysis which uses the path descriptors of selected hubs to further reduce the size of the path descriptors of the selected hubs.

14. A computer system according to claim 12, further comprising a processing system for timing analysis which uses the path descriptors of selected hubs to further reduce the size of the path descriptors of the selected hubs.

* * * * *